United States Patent
Beukema et al.

(10) Patent No.: US 9,853,839 B2
(45) Date of Patent: Dec. 26, 2017

(54) SYSTEM, METHOD AND SOFTWARE PROGRAM FOR TUNEABLE EQUALIZER ADAPTATION USING SAMPLE INTERPOLATION

(71) Applicant: GLOBALFOUNDRIES INC., Grand Cayman (KY)

(72) Inventors: Troy J. Beukema, Briarcliff Manor, NY (US); Matthew B. Baecher, Rock Tavern, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/164,162

(22) Filed: May 25, 2016

(65) Prior Publication Data
US 2017/0346662 A1 Nov. 30, 2017

(51) Int. Cl.
| | |
|---|---|
| H03H 7/30 | (2006.01) |
| H03H 7/40 | (2006.01) |
| H03K 5/159 | (2006.01) |
| H04L 25/03 | (2006.01) |
| H04L 7/00 | (2006.01) |
| H03M 1/12 | (2006.01) |

(52) U.S. Cl.
CPC ........ *H04L 25/03019* (2013.01); *H03M 1/12* (2013.01); *H04L 7/002* (2013.01); *H04L 25/03878* (2013.01); *H04L 2025/03624* (2013.01)

(58) Field of Classification Search
CPC ................ H04L 25/03019; H04L 7/02; H04L 25/03878; H04L 25/03057; H04L 25/03885; H04L 27/01; H03M 1/12
See application file for complete search history.

(56) References Cited

U.S. PATENT DOCUMENTS

| | | | | |
|---|---|---|---|---|
| 8,958,512 B1* | 2/2015 | Ding | ................ | H04L 25/03057 375/229 |
| 9,276,782 B1* | 3/2016 | Zhang | ............... | H04L 25/03057 |
| 9,450,788 B1* | 9/2016 | Cops | ................. | H04L 25/03057 |
| 2008/0304557 A1* | 12/2008 | Hollis | ............... | H04L 25/03885 375/231 |
| 2009/0316772 A1* | 12/2009 | Hidaka | ............. | H04L 25/03057 375/233 |
| 2012/0106687 A1* | 5/2012 | Bulzacchelli | ........... | H04L 25/14 375/354 |

(Continued)

OTHER PUBLICATIONS

Toifl, T., et al., "Low-Complexity Adaptive Equalization for High-Speed Chip-to-Chip Communication Paths by Zero-Forcing of Jitter Components", IEEE Transactions on Communications, (Sep. 2006), vol. 54, No. 9, pp. 1554-1557.

*Primary Examiner* — Shuwang Liu
*Assistant Examiner* — Sung Ahn
(74) *Attorney, Agent, or Firm* — Scully, Scott, Murphy & Presser PC; Frank S. DiGiglio

(57) ABSTRACT

Various embodiments of the present invention solve the problem of generating intermediate-time information useable to drive ZFE adaptation (for example, in connection with a digital receiver). Further, various embodiments of the present invention increase flexibility by enabling user-specified over-peaking and/or under-peaking (i.e. configurable equalizer tuning) with respect to a ZFE convergence (or lock) criterion.

20 Claims, 11 Drawing Sheets

(56) References Cited

U.S. PATENT DOCUMENTS

2013/0243071 A1* 9/2013 Chmelar ............... H04L 25/063
 375/233
2014/0169440 A1* 6/2014 Kotagiri ............... H04L 25/063
 375/233
2016/0352557 A1* 12/2016 Liao .................... H04L 27/3809

* cited by examiner

Sixth order interpolation polynomials
DEL 0.000000e+h 0.000000e+00,h 0.000000e+00, 0.000000e+00, 0.000000e+00, 0.000000e+00, -0.000000e+00 ]
DEL 3.125000e-02 h [-3.966854e-04, 4.295382e-03, -1.960195e-02, 9.907054e-02, 3.528953e-02, -1.441916e-02, 5.499733e-03 ]
DEL 6.250000e-02 h [2.880044e-03, 1.663268e-03, -2.844366e-02, 9.686156e-02, 8.083457e-02, -3.486713e-02, 1.380652e-02 ]
DEL 9.375000e-02 h [6.843551e-03, -2.047825e-03, -3.487383e-02, 9.431737e-02, 1.281036e-01, -5.531569e-02, 2.183966e-02 ]
DEL 1.250000e-01 h [9.836237e-03, -3.803766e-03, -4.305767e-02, 9.190472e-02, 1.729251e-01, -7.294396e-02, 2.826900e-02 ]
DEL 1.562500e-01 h [1.153541e-02, -3.159041e-03, -5.350663e-02, 8.968291e-02, 2.147653e-01, -8.748263e-02, 3.305841e-02 ]
DEL 1.875000e-01 h [1.213615e-02, -6.083591e-04, -6.546325e-02, 8.757261e-02, 2.530038e-01, -9.947581e-02, 3.655190e-02 ]
DEL 2.187500e-01 h [1.191748e-02, 3.239156e-03, -7.805354e-02, 8.548379e-02, 2.922999e-01, -1.094972e-01, 3.908465e-02 ]
DEL 2.500000e-01 h [1.111467e-02, 7.886167e-03, -9.058739e-02, 8.334812e-02, 3.293122e-01, -1.179671e-01, 4.090129e-02 ]
DEL 2.812500e-01 h [9.903763e-03, 1.296438e-02, -1.025715e-01, 8.111989e-02, 3.656960e-01, -1.251585e-01, 4.216586e-02 ]
DEL 3.125000e-01 h [8.413524e-03, 1.820496e-02, -1.136619e-01, 7.877034e-02, 4.016562e-01, -1.312387e-01, 4.298584e-02 ]
DEL 3.437500e-01 h [6.739633e-03, 2.340819e-02, -1.236185e-01, 7.628244e-02, 4.372959e-01, -1.363044e-01, 4.343158e-02 ]
DEL 3.750000e-01 h [4.955523e-03, 2.842128e-02, -1.322722e-01, 7.364717e-02, 4.726496e-01, -1.404060e-01, 4.354947e-02 ]
DEL 4.062500e-01 h [3.119822e-03, 3.312353e-02, -1.395038e-01, 7.086105e-02, 5.077059e-01, -1.436641e-01, 4.337036e-02 ]
DEL 4.375000e-01 h [1.281237e-03, 3.741689e-02, -1.452300e-01, 6.792456e-02, 5.424219e-01, -1.457796e-01, 4.291498e-02 ]
DEL 4.687500e-01 h [-5.182946e-04, 4.122009e-02, -1.493946e-01, 6.484116e-01, 5.767323e-01, -1.470401e-01, 4.219744e-02 ]
DEL 5.000000e-01 h [-2.241623e-03, 4.446503e-02, -1.519634e-01, 6.161657e-01, 6.105558e-01, -1.473244e-01, 4.122768e-02 ]

| Value | Delay(UI) | INT0 | INT1 | INT2 | INT3 | INT4 | INT5 | INT6 | INT7 |
|---|---|---|---|---|---|---|---|---|---|
| 0 | 0.00000 | 0.00000 | 0.00000 | 0.00000 | 0.00000 | 1.00000 | 0.00000 | 0.00000 | 0.00000 |
| 1 | 0.03125 | 0.00000 | 0.00550 | -0.01442 | 0.03529 | 0.99071 | -0.01960 | 0.00430 | -0.00040 |
| 2 | 0.06250 | 0.00000 | 0.01381 | -0.03487 | 0.08083 | 0.96862 | -0.02844 | 0.00166 | 0.00288 |
| 3 | 0.09375 | 0.00000 | 0.02184 | -0.05532 | 0.12810 | 0.94317 | -0.03487 | -0.00205 | 0.00684 |
| 4 | 0.12500 | 0.00000 | 0.02827 | -0.07294 | 0.17293 | 0.91905 | -0.04306 | -0.00380 | 0.00984 |
| 5 | 0.15625 | 0.00000 | 0.03306 | -0.08748 | 0.21477 | 0.89683 | -0.05351 | -0.00316 | 0.01154 |
| 6 | 0.18750 | 0.00000 | 0.03655 | -0.09948 | 0.25430 | 0.87573 | -0.06546 | -0.00061 | 0.01214 |
| 7 | 0.21875 | 0.00000 | 0.03908 | -0.10950 | 0.29230 | 0.85484 | -0.07805 | 0.00324 | 0.01192 |
| 8 | 0.25000 | 0.00000 | 0.04090 | -0.11797 | 0.32931 | 0.83348 | -0.09059 | 0.00789 | 0.01111 |
| 9 | 0.28125 | 0.00000 | 0.04217 | -0.12516 | 0.36570 | 0.81120 | -0.10257 | 0.01296 | 0.00990 |
| 10 | 0.31250 | 0.00000 | 0.04299 | -0.13124 | 0.40166 | 0.78770 | -0.11366 | 0.01820 | 0.00841 |
| 11 | 0.34375 | 0.00000 | 0.04343 | -0.13630 | 0.43730 | 0.76282 | -0.12362 | 0.02341 | 0.00674 |
| 12 | 0.37500 | 0.00000 | 0.04355 | -0.14041 | 0.47265 | 0.73647 | -0.13227 | 0.02842 | 0.00496 |
| 13 | 0.40625 | 0.00000 | 0.04337 | -0.14356 | 0.50771 | 0.70861 | -0.13950 | 0.03312 | 0.00312 |
| 14 | 0.43750 | 0.00000 | 0.04291 | -0.14578 | 0.54242 | 0.67925 | -0.14523 | 0.03742 | 0.00128 |
| 15 | 0.46875 | 0.00000 | 0.04220 | -0.14704 | 0.57673 | 0.64841 | -0.14939 | 0.04122 | -0.00052 |
| 16 | 0.50000 | 0.00000 | 0.04123 | -0.14732 | 0.61056 | 0.61617 | -0.15196 | 0.04447 | -0.00224 |
| 17 | 0.53125 | -0.00052 | 0.04122 | -0.14939 | 0.64841 | 0.57673 | -0.14704 | 0.04220 | 0.00000 |
| 18 | 0.56250 | 0.00128 | 0.03742 | -0.14523 | 0.67925 | 0.54242 | -0.14578 | 0.04291 | 0.00000 |
| 19 | 0.59375 | 0.00312 | 0.03312 | -0.13950 | 0.70861 | 0.50771 | -0.14356 | 0.04337 | 0.00000 |
| 20 | 0.62500 | 0.00496 | 0.02842 | -0.13227 | 0.73647 | 0.47265 | -0.14041 | 0.04355 | 0.00000 |
| 21 | 0.65625 | 0.00674 | 0.02341 | -0.12362 | 0.76282 | 0.43730 | -0.13630 | 0.04343 | 0.00000 |
| 22 | 0.68750 | 0.00841 | 0.01820 | -0.11366 | 0.78770 | 0.40166 | -0.13124 | 0.04299 | 0.00000 |
| 23 | 0.71875 | 0.00990 | 0.01296 | -0.10257 | 0.81120 | 0.36570 | -0.12516 | 0.04217 | 0.00000 |
| 24 | 0.75000 | 0.01111 | 0.00789 | -0.09059 | 0.83348 | 0.32931 | -0.11797 | 0.04090 | 0.00000 |
| 25 | 0.78125 | 0.01192 | 0.00324 | -0.07805 | 0.85484 | 0.29230 | -0.10950 | 0.03908 | 0.00000 |
| 26 | 0.81250 | 0.01214 | -0.00061 | -0.06546 | 0.87573 | 0.25430 | -0.09948 | 0.03655 | 0.00000 |
| 27 | 0.84375 | 0.01154 | -0.00316 | -0.05351 | 0.89683 | 0.21477 | -0.08748 | 0.03306 | 0.00000 |
| 28 | 0.87500 | 0.00984 | -0.00380 | -0.04306 | 0.91905 | 0.17293 | -0.07294 | 0.02827 | 0.00000 |
| 29 | 0.90625 | 0.00684 | -0.00205 | -0.03487 | 0.94317 | 0.12810 | -0.05532 | 0.02184 | 0.00000 |
| 30 | 0.93750 | 0.00288 | 0.00166 | -0.02844 | 0.96862 | 0.08083 | -0.03487 | 0.01381 | 0.00000 |
| 31 | 0.96875 | -0.00040 | 0.00430 | -0.01960 | 0.99071 | 0.03529 | -0.01442 | 0.00550 | 0.00000 |
| 32 | 1.00000 | 0.00000 | 0.00000 | 0.00000 | 1.00000 | 0.00000 | 0.00000 | 0.00000 | 0.00000 |

SYSTEM, METHOD AND SOFTWARE PROGRAM FOR TUNEABLE EQUALIZER ADAPTATION USING SAMPLE INTERPOLATION

BACKGROUND OF THE INVENTION

Field of the Invention

In a conventional digital receiver system which samples data at a given BAUD rate (once per symbol transmission interval), there is no intermediate-time information available to adapt an analog continuous-time equalizer ("CTE") and/or feed-forward equalizer ("FFE") according to an optimal zero-force edge ("ZFE") convergence (or lock) criterion.

Various embodiments of the present invention solve the problem of generating intermediate-time information useable to drive ZFE adaptation. Further, various embodiments of the present invention increase flexibility by enabling user-specified over-peaking and/or under-peaking (i.e. configurable equalizer tuning) with respect to the ZFE convergence (or lock) criterion.

Description of Related Art

T. Toifl et. al. ("Low Complexity Adaptive Equalization for High-Speed Chip-to-Chip Communication Paths by Zero-Forcing of Jitter Components", IEEE Trans. Commun. vol. 54, no. 9, September 2006 pp. 1554-57) describes the basic concept of zero-forcing of jitter components by adapting a feed-forward equalizer.

This concept has also been applied to adapt both a receiver peaking amplifier (which realizes a similar function as an FFE postcursor) and FFE precursor(s)/postcursor(s) in analog input/output ("I/O") core designs. In these analog designs, a dedicated "edge path" sampler is available which samples the "jitter component" or edge intersymbol interference ("ISI"). This edge ISI sample is missing in a digital I/O core (which samples only at the data sample point).

SUMMARY

As mentioned above, an edge ISI sample is missing in a digital I/O core. Various embodiments of the present invention overcome this problem by generating intermediate-time information useable to drive adaptation (e.g., continuous-time equalizer adaptation and/or feed-forward equalizer adaptation) in the context of a baud-rate sampled digital receiver.

In one embodiment, a system is provided, comprising: an analog continuous-time equalizer, the analog continuous-time equalizer being configured to obtain data in the form of an analog signal; an analog-to-digital converter in operative communication with the analog continuous-time equalizer, the analog-to-digital converter being configured to receive an output from the analog continuous-time equalizer; a feed-forward equalizer in operative communication with the analog-to-digital converter, the feed-forward equalizer being configured to receive an output from the analog-to-digital converter; a first buffer in operative communication with the feed-forward equalizer, the first buffer being configured to capture an output of the feed-forward equalizer; an interpolator in operative communication with the first buffer, the interpolator being configured to receive an output from the first buffer; a second buffer, the second buffer being configured to capture one of: (a) the output of the feed-forward equalizer via operative communication with the feed-forward equalizer; and (b) data based upon the output of the feed-forward equalizer; a zero-force edge calculator in operative communication with the interpolator, the second buffer and the analog continuous-time equalizer, the zero-force edge calculator being configured to receive an output from the interpolator and an output from the second buffer, the zero-force edge calculator being further configured to feed back continuous-time equalizer adaptation data to the analog continuous-time equalizer; wherein the continuous-time equalizer adaptation data fed back by the zero-force edge calculator to the analog continuous-time equalizer is based at least in part upon the output from the interpolator and the second buffer.

In another embodiment, a method is provided, comprising: receiving data in the form of an analog signal; applying the received data to an analog continuous-time equalizer process; applying an output of the analog continuous-time equalizer process to an analog-to-digital converter process; applying an output of the analog-to-digital converter process to a feed-forward equalizer process; capturing an output of the feed-forward equalizer process in a first buffer process; applying an output of the first buffer process to an interpolation process; capturing in a second buffer process one of: (a) an output of the feed-forward process; and (b) an output of another process based upon the output of the feed-forward process; applying an output of the interpolation process to a zero-force edge process; applying an output of the second buffer process to the zero-force edge process; and feeding back at least part of an output of the zero-force edge process to the analog continuous-time equalizer process.

In another embodiment, a computer-readable storage device is provided having stored thereon computer-readable instructions that, when executed by a computer, implement: receiving data in the form of an analog signal; applying the received data to an analog continuous-time equalizer process; applying an output of the analog continuous-time equalizer process to an analog-to-digital converter process; applying an output of the analog-to-digital converter process to a feed-forward equalizer process; capturing an output of the feed-forward equalizer process in a first buffer process; applying an output of the first buffer process to an interpolation process; capturing in a second buffer process one of: (a) an output of the feed-forward process; and (b) an output of another process based upon the output of the feed-forward process; applying an output of the interpolation process to a zero-force edge process; applying an output of the second buffer process to the zero-force edge process; and feeding back at least part of an output of the zero-force edge process to the analog continuous-time equalizer process.

BRIEF DESCRIPTION OF THE DRAWINGS

The drawings are provided for illustrative purpose only and do not necessarily represent practical examples of the present invention to scale.

FIG. 2A shows a graph of an example fractional delay interpolator frequency response according to an embodiment of the present invention and FIG. 2B shows a corresponding example sixth order fractional delay interpolation polynomials used for the graph of FIG. 2A.

FIG. 7 shows an example of a fractional delay interpolator polynomial lookup table according to an embodiment of the present invention.

DETAILED DESCRIPTION OF THE INVENTION

One embodiment of the present invention relates to a system for tuneable equalizer adaptation using sample interpolation. Another embodiment of the present invention relates to a method for tuneable equalizer adaptation using sample interpolation. Another embodiment of the present invention relates to a software program for tuneable equalizer adaptation using sample interpolation.

Various embodiments of the present invention are based upon the observation that the zero-forcing of jitter components is equivalent to decorrelating ISI that arises from a data bit and appears at an edge crossover position at, for example, 1.5 unit intervals ("UI") delayed (from the data bit).

In various embodiments, the intermediate sample position data at the 1.5 unit interval delay is estimated using interpolation polynomials applied to the sampled data (i.e., the received data after analog-to-digital conversion). The sampled data is measured at discrete unit intervals with a time period "T" corresponding to an ADC sample rate of FS=1.0/T samples/sec.

Figure 2A:
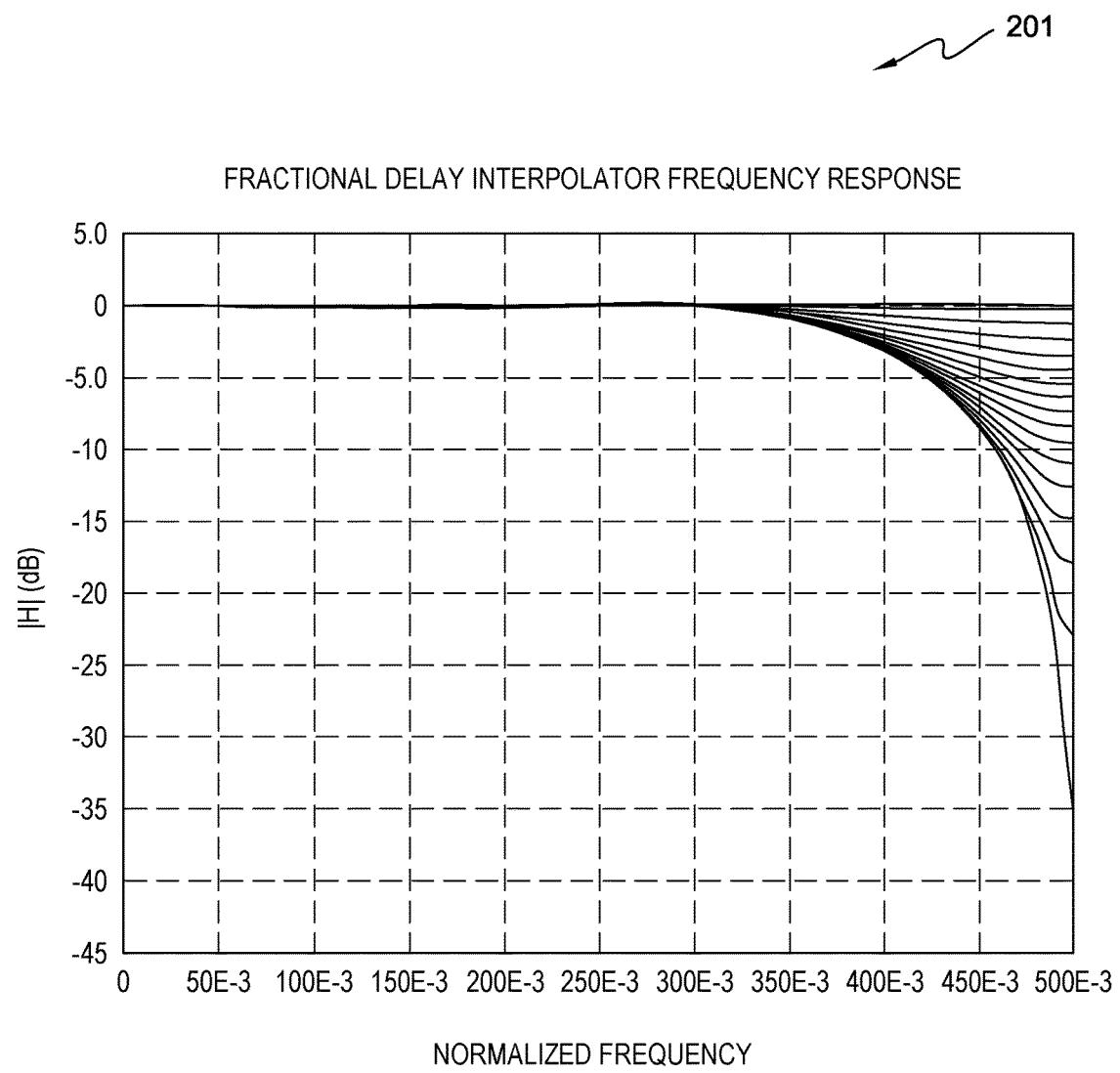

There are certain advantages to decorrelating 1.5 UI distant ISI computed by the interpolation polynomials. ISI added to the signal by the interpolation polynomials is reduced as the time delay of the ISI gets larger and larger—since the interpolation polynomial coefficients rapidly decay in magnitude beyond +−1 unit samples from the polynomial central delay. As a specific example to further illustrate this point, a first order linear interpolation polynomial has coefficients {0.5, 0.5} which achieve a central delay of 0.5 UI, and polynomial tap weights removed +−1 unit samples from this central delay are 0. In another specific example illustrating an improved accuracy interpolation polynomial over the first order interpolator, a $6^{th}$ order interpolation polynomial targeting a design bandwidth of FS/3 at an interpolation delay of ½ UI is used. This design bandwidth (as opposed to a lower design bandwidth such as FS/4 or FS/8) reduces unwanted ISI contributed by the interpolation polynomials at the 1.5 UI distant delay while still being sufficiently lower than the Nyquist sample frequency of FS/2 to enable the design of an accurate $6^{th}$ order interpolation polynomial. At smaller interpolation delays than 0.5 UI, it is possible to target greater than FS/3 design bandwidth while using a $6^{th}$ order interpolation polynomial. In particular, the polynomials with very small interpolation delay from the digitized samples such as 1/32 UI may have an interpolation bandwidth approaching the Nyquist sample rate of FS/2 (as illustrated in FIG. 2A, discussed in more detail below).

In one example, an array of interpolation polynomials is applied to vary the interpolation delay as a function of estimated edge delay from the digitized samples. In another example, tuneable peaking is achieved by offsetting the estimated edge delay (enabling a user to achieve more, less, or equivalent peaking compared to the zero-force edge convergence (or lock) criterion).

Figure 1:
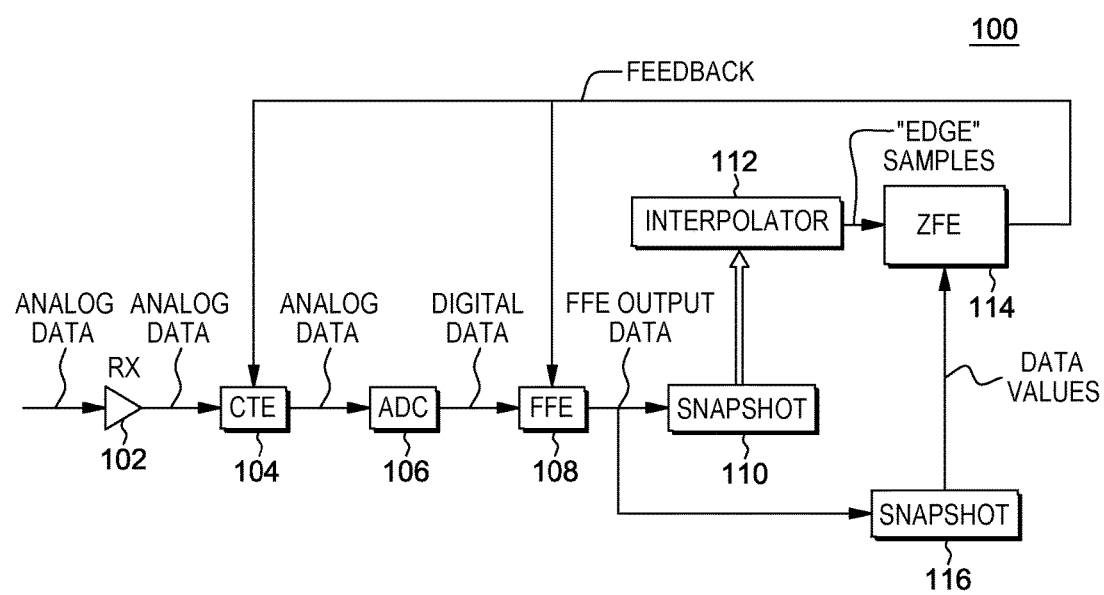
FIG. 1 shows a block diagram of a digital receiver system providing an example implementation according to an embodiment of the present invention.

Referring now to FIG. 1, a block diagram of a digital receiver system providing an example implementation according to one embodiment of the present invention is shown. In this embodiment, baud-rate interpolation to support ZFE adaptation is provided (via creation of estimated edge samples that are used to drive ZFE adaptation of the CTE and FFE postcursor). Such baud-rate interpolation is sufficiently accurate when used in conjunction with ZFE since ZFE reacts to ISI at a 1.5 UI distant delay from source data as discussed above. As a result, a delay interpolator can be implemented with sufficient accuracy when driven off BAUD-rate sampled data (i.e., data that undergoes analog-to-digital conversion at the BAUD rate).

Still referring to FIG. 1, digital receiver 100 (which may be implemented, for example, as a dedicated integrated circuit ("IC") chip, as a field-programmable gate array ("FPGA"), or as an application-specific integrated circuit ("ASIC")) is provided. Digital receiver 100 includes receiver component ("RX") 102, which receives analog data and outputs the received analog data to CTE 104 (operating as a peaking amplifier). The CTE 104 then provides an output to analog-to-digital converter ("ADC") 106. The ADC in turn outputs digital data that drives FFE 108. FFE 108 provides sequential output samples (e.g., 8-bit samples) that are periodically captured in snapshot buffer 110. The samples in the snapshot buffer 110 are provided to interpolator 112, which performs interpolation of the samples using optimal fractional delay interpolation polynomials. In one example, the fractional delay interpolation polynomials are designed for a flat frequency response from normalized frequency 0 to a minimum of FS/3 (FIGS. 2A and 2B, described in more detail below, provide specific examples of such fractional delay interpolation polynomials). The interpolated samples (representing estimated "edge" information) are created in the interpolator 112 via application of the samples from the snapshot buffer 110 to the fractional delay interpolation polynomials.

Once each interpolated edge sample is computed, each interpolated edge sample is provided to ZFE 114. Also provided to ZFE 114 are data values from snapshot buffer 116, which receives at an input thereto the same sequential output samples from FFE 108 that are provided to snapshot buffer 110.

Still referring to FIG. 1, it is noted that each interpolated edge sample (from interpolator 112) provided to ZFE 114 is decorrelated with 1.5 unit interval distant data (from snapshot buffer 116) according to a conventional ZFE convergence (or lock) criterion. Further, in one example, the adaptation accomplishes a joint equalization of the CTE and FFE by a two stage process as follows: (1) first adapting the CTE peaking setting until the CTE peaking setting converges to the ZFE convergence (or lock) criterion (i.e., edge ISI decorrelated from data bit 1.5 unit interval distant); and (2) next, the FFE postcursor is adapted to the ZFE convergence (or lock) criterion. Since the FFE normally has much finer resolution than the peaking amplifier, the second stage of ZFE lock on the FFE postcursor can be viewed as a fine tune equalization while the CTE can be viewed as a coarse tune equalization.

Referring now to FIG. 2A, a graph 201 of an example fractional delay interpolator frequency response according to an embodiment of the present invention is shown (as seen, the x-axis of graph 201 is "Normalized Frequency" and the y-axis of graph 201 is "|H| (dB)". Further, FIG. 2B shows a set 203 of corresponding example sixth order fractional delay interpolation polynomials used for the graph of FIG. 2A. As seen in FIG. 2B, the fractional delay interpolation polynomials of this example are 6th order, or 7 tap polynomials. In one specific example, 17 sets of fractional delay interpolation polynomials are used to form a range of fractional delays varying from 0 to 0.5 unit interval in steps of 1.0/32 unit interval.

The delay used on a given channel is in turn derived from an estimated edge location relative to the sampled data. The estimated edge location may be found by using a simple conventional closed-loop early/late phase detector apparatus of the type known in the art. In this approach, the polynomial interpolation delay is varied until a conventional early/late phase detector outputs an equal number of early/late determinations on average when provided the interpolated edge and detected data information. In an embodiment which uses a decision-feedback equalizer, the edge location may be estimated using an open-loop technique based on a first decision-feedback equalization tap value, which may be independently derived using a conventional technique. As an illustrative example, a first decision-feedback equalization tap may have a normalized value of 0, indicating an interpolation delay of 0.5 is needed to estimate the edge crossover, or a normalized value of 1.0, indicating an interpolation delay of 0 is needed to estimate edge crossover, or a normalized value between 0 and 1.0, indicating an interpolation delay between 0 to 0.5 is needed to estimate the edge crossover. A linear relationship of a first decision-feedback tap value "h1" to the edge delay can then be used to estimate the edge delay and subsequently select the appropriate interpolation polynomial corresponding to the estimated delay, specifically:

Estimated edge delay=$h1*k$ where constant "k" is chosen by the user to optimize the accuracy of the estimated edge delay.

Figure 3A:
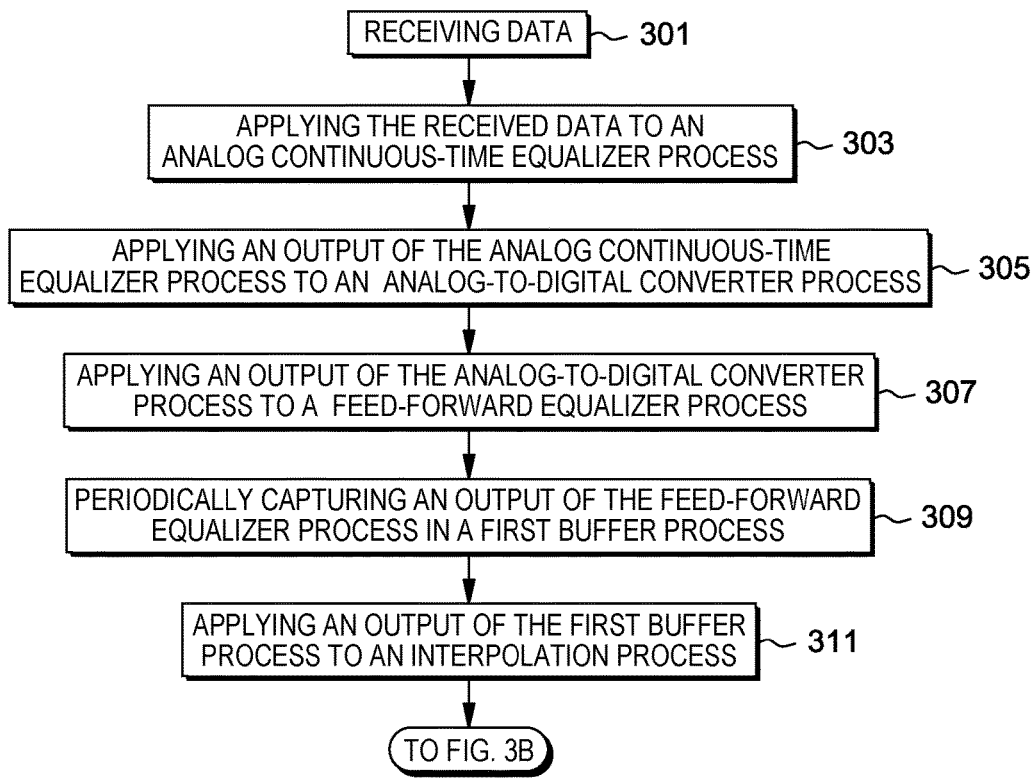
FIGS. 3A and 3B show a block diagram of a method according to an embodiment of the present invention.
Figure 3B:
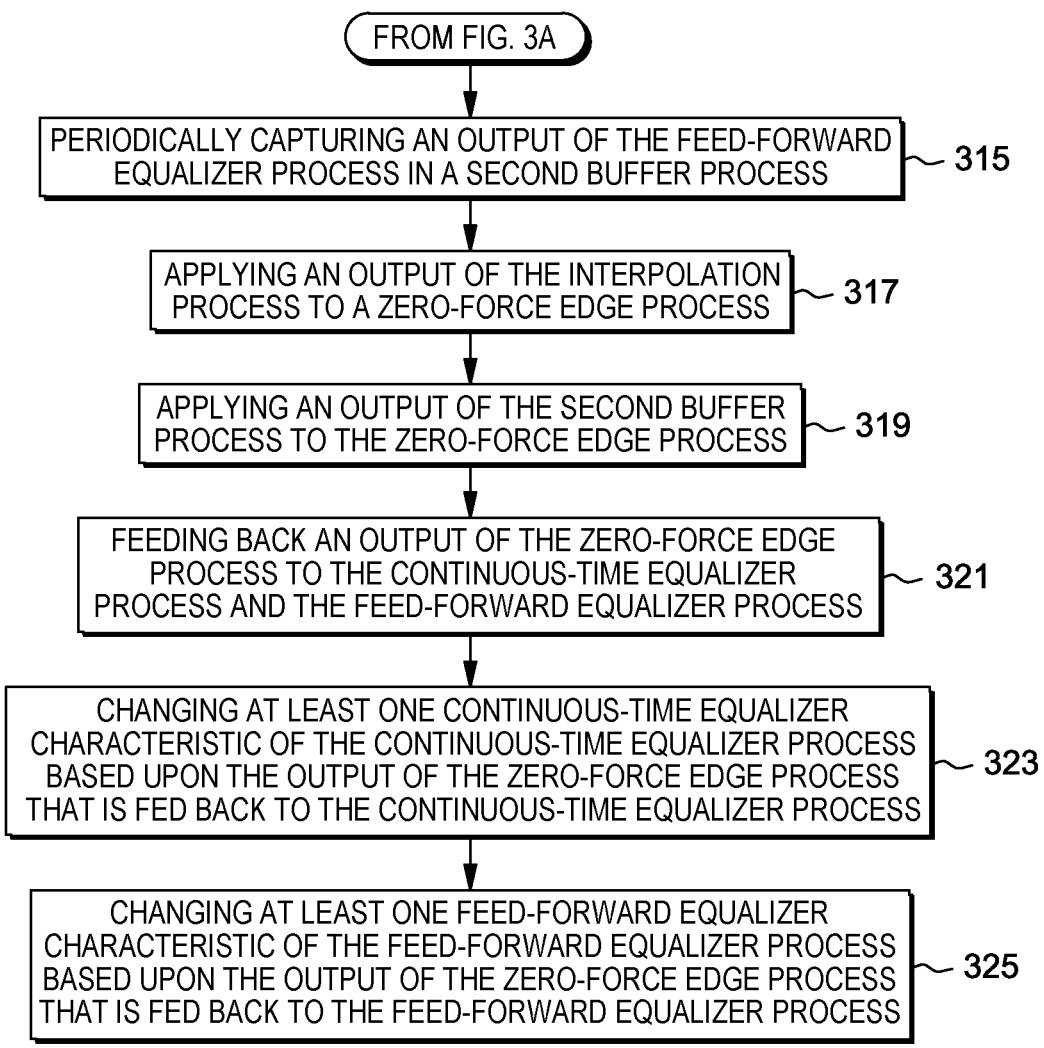

Referring now to FIGS. 3A and 3B, a block diagram of a method according to an embodiment of the present invention is shown. As seen in these FIGS. 3A and 3B, the method comprises: at block 301—receiving data in the form of an analog signal; at block 303—applying the received data to an analog continuous-time equalizer process; at block 305—applying an output of the analog continuous-time equalizer process to an analog-to-digital converter process; at block 307—applying an output of the analog-to-digital converter process to a feed-forward equalizer process; at block 309—periodically capturing an output of the feed-forward equalizer process in a first buffer process; at block 311—applying an output of the first buffer process to an interpolation process; at block 315—periodically capturing an output of the feed-forward equalizer process in a second buffer process; at block 317—applying an output of the interpolation process to a zero-force edge process; at block 319—applying an output of the second buffer process to the zero-force edge process; at block 321—feeding back an output of the zero-force edge process to the continuous-time equalizer process and the feed-forward equalizer process; at block 323—changing at least one continuous-time equalizer characteristic of the continuous-time equalizer process based upon the output of the zero-force edge process that is fed back to the continuous-time equalizer process; and at block 325—changing at least one feed-forward equalizer characteristic of the feed-forward equalizer process based upon the output of the zero-force edge process that is fed back to the feed-forward equalizer process. In one specific example, each of: the first buffer process of block 309 and the interpolation process of block 311 are carried out concurrently with the second buffer process of block 315 (wherein the ZFE process of blocks 317 and 319 operates on corresponding edge samples and data samples).

Figure 4:
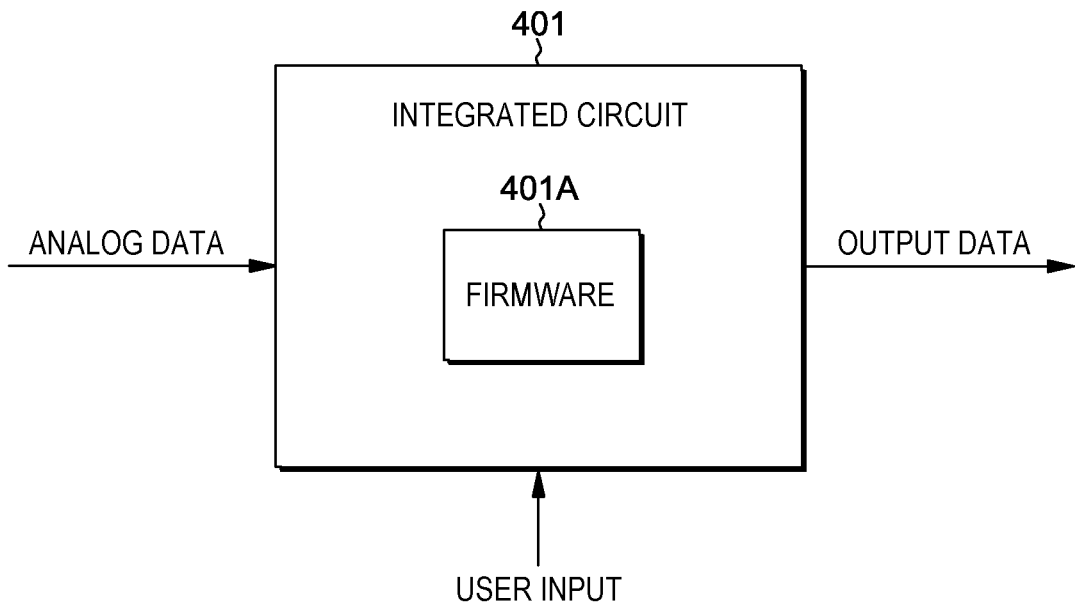
FIG. 4 shows a block diagram of a digital receiver system providing an example implementation according to an embodiment of the present invention.

Referring now to FIG. 4, a block diagram of a digital receiver system providing an example implementation according to an embodiment of the present invention is shown. As seen in this FIG. 4, integrated circuit ("IC") 401 receives input analog data (such as the type of analog data received by RX 102 of FIG. 1) and provides output data. In one specific example, integrated circuit 401 may be configured to operate by implementing elements of the type described in connection with FIG. 1. In another specific example, integrated circuit 401 may include firmware 401A. In another specific example, integrated circuit 401 may receive user input. (e.g., via keyboard, mouse, and/or any other appropriate user interface (e.g., graphical user interface associated with a display)). Such user input may permit the user to vary the interpolator delay offset (thus enabling the user to achieve more or less peaking than the standard ZFE algorithm would provide, as discussed in more detail below).

Figure 5:
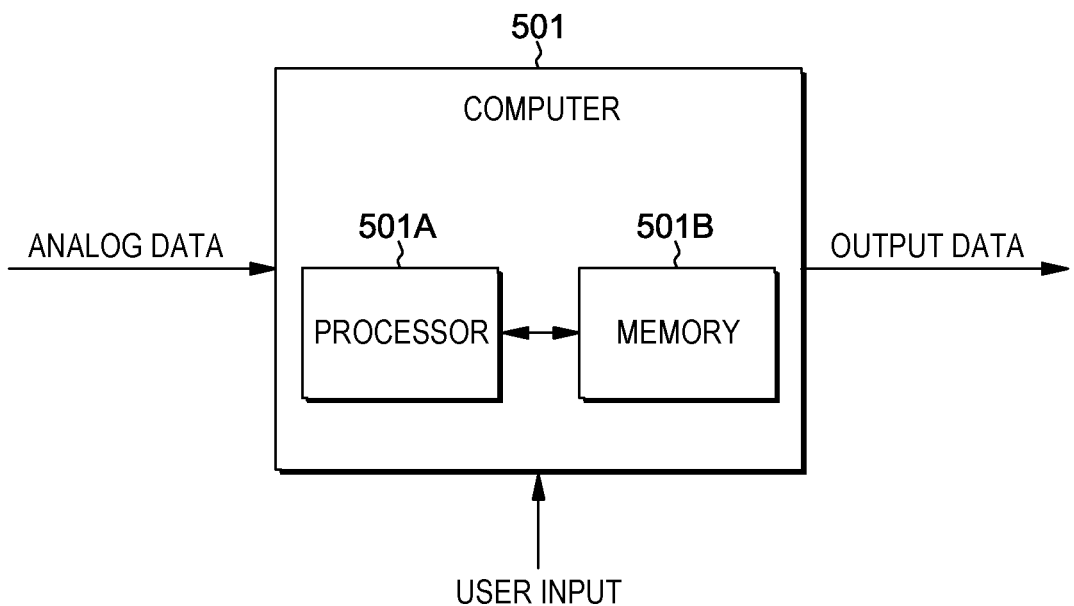
FIG. 5 shows a block diagram of a digital receiver system providing an example implementation according to an embodiment of the present invention.

Referring now to FIG. 5, a block diagram of a digital receiver system providing an example implementation according to an embodiment of the present invention is shown. As seen in this FIG. 5, computer 501 receives input analog data (such as the type of analog data received by RX 102 of FIG. 1) and provides output data. In one specific example, computer 501 may be configured to operate by implementing elements of the type described in connection with FIG. 1. In another specific example, computer 501 may include processor (e.g., CPU) 501A and memory 501B (which operatively communicate). Memory 501B may be a computer-readable medium including computer-readable instructions (or processor-readable instructions) that, when executed by processor 501A implement the required functionality. In another specific example, memory 501B may be a hardware device (such as a solid-state memory or an optical memory device or a magnetic memory device). In another specific example, computer 501 may receive user input (e.g., via keyboard, mouse, and/or any other appropriate user interface (e.g., graphical user interface associated with a display)). Again, user input may permit the user to vary the interpolator delay offset (thus enabling the user to achieve more or less peaking than the standard ZFE algorithm would provide, as discussed in more detail below). Further, the computer 501 may provide output to (and/or receive back input from) one or more of a display and/or a printer.

Figure 6:
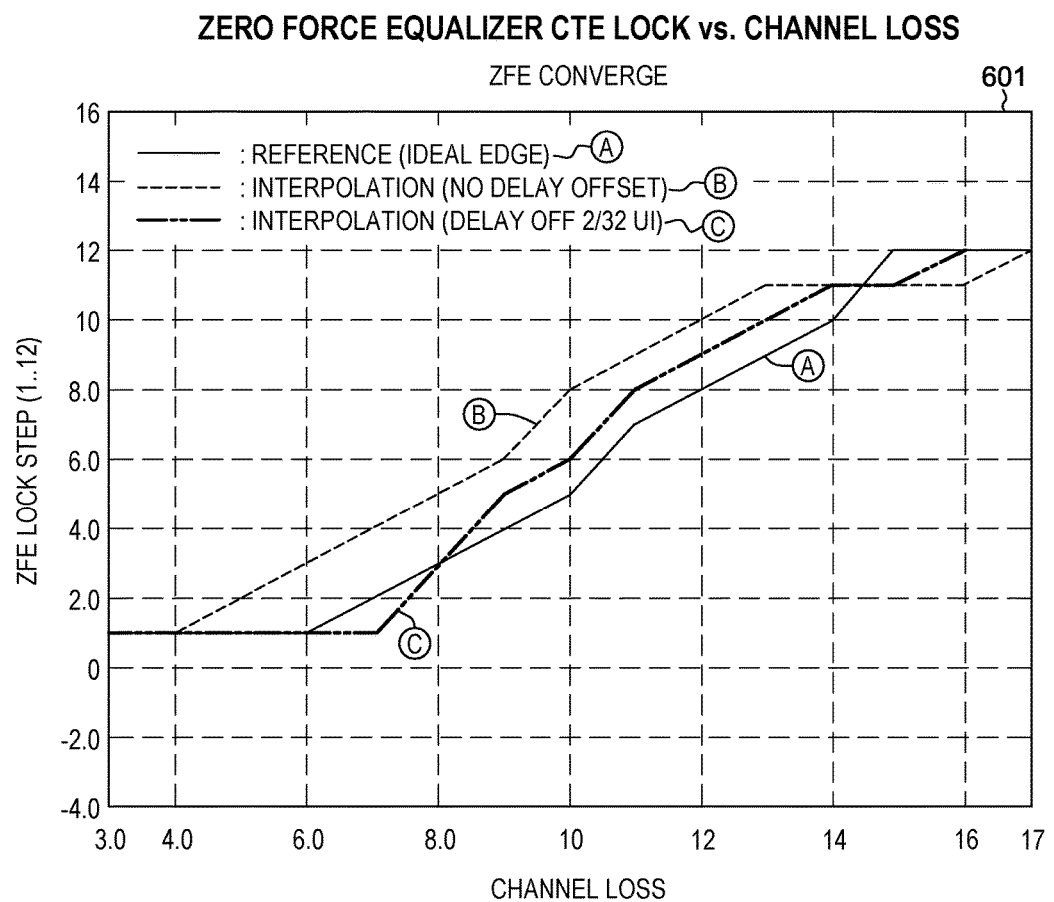
FIG. 6 shows a graph with simulation results (illustrating the peaking amplifier setting found for both known-edge data (reference) and inventive interpolated-edge data).

Referring now to FIG. 6, a graph 601 of Zero-Force Equalizer CTE Lock vs Channel Loss showing simulation results (illustrating the peaking amplifier setting found for both known-edge data (reference) and inventive interpolated-edge data) is provided. As seen, the x-axis of Graph 601 is Channel Loss and the y-axis of graph 601 is ZFE Lock Step (1 . . . 12). The trace labeled as "A" is the Reference (ideal edge), the trace labeled as "B" is Interpolation (no delay offset) and the trace labeled as "C" is Interpolation (delay offset $2/32$ unit interval). In this example, use of the interpolated values resulted in approximately 2 dB less applied peaking compared to the known-edge solution. This bias may be addressed by offsetting the estimated edge location interpolator delay by 2/32 unit interval. This results in similar peaking (within +−1 peaking amplifier step, or approximately +−1 dB accuracy in this example) found for both known-edge and interpolated-edge techniques.

As described herein, a dynamic peaking control ("DPC") using a zero-force edge mechanism which attempts to minimize ISI at the EDGE location is provided. The zero-force edge algorithm uses both DATA and EDGE samples. However, the sampling system only captures DATA samples. The EDGE samples are computed using an interpolation function which is modeled, in one specific example, as a $6^{th}$ order polynomial:

$$EDGE[n] = \sum_{i=0}^{6} INT[i] \cdot S[i+n-4]$$

where n is valid (in this example) from 3 to 12 with a 16 sample size (0:15) snapshot capture. The coefficient values for the interpolation (in this example) are shown as INT[i] in the fractional interpolator polynomial lookup table 701 of FIG. 7, where various delays are created.

Figure 8:
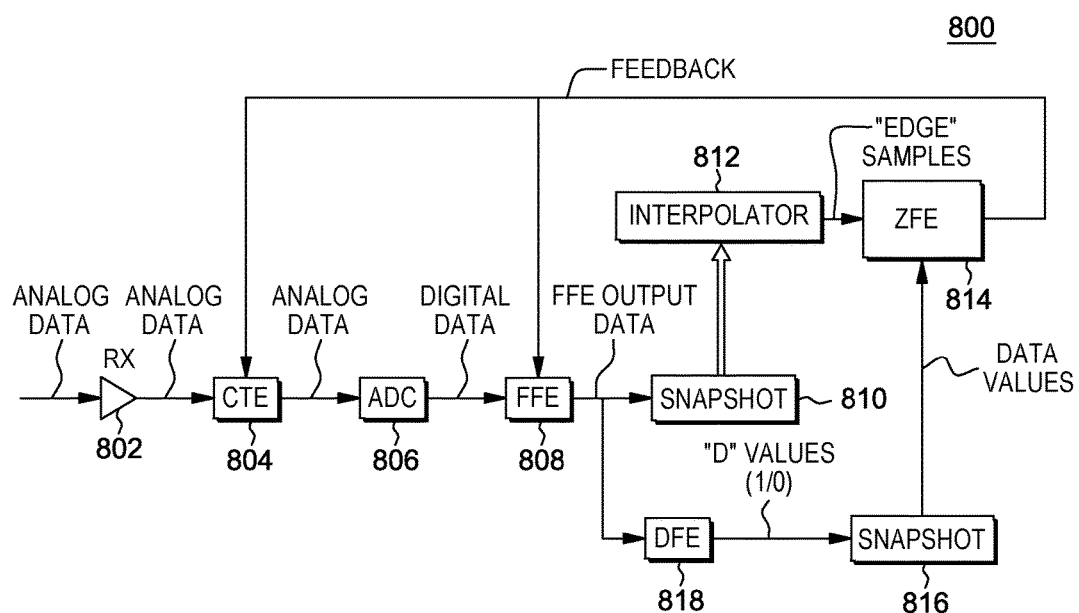
FIG. 8 shows a block diagram of a digital receiver system providing an example implementation according to an embodiment of the present invention.

Referring now to FIG. 8, a block diagram of a digital receiver system providing an example implementation according to one embodiment of the present invention is shown. This embodiment is similar to the embodiment of FIG. 1, with the addition of decision-feedback equalizer ("DFE") 818. This embodiment of FIG. 8 otherwise operates in a similar manner to the embodiment of FIG. 1. More particularly, this embodiment of FIG. 8 utilizes digital receiver 800 (which may be implemented, for example, as a dedicated IC chip, as a FPGA, or as an ASIC). Digital receiver 800 includes receiver component ("RX") 802, which receives analog data and outputs the received analog data to CTE 804 (operating as a peaking amplifier). The CTE 804 then provides an output to ADC 806. The ADC in turn outputs digital data that drives FFE 808. FFE 808 provides sequential output samples (e.g., 8-bit samples) that are periodically captured in snapshot buffer 810. The samples in the snapshot buffer 810 are provided to interpolator 812, which performs interpolation of the samples using optimal fractional delay interpolation polynomials.

Once each interpolated edge sample is computed, each interpolated edge sample is provided to ZFE 814. Also provided to ZFE 814 are data values from snapshot buffer 816 (snapshot buffer 816 is fed data values from DFE 818, which receives at an input thereto the same sequential output samples from FFE 808 that are provided to snapshot buffer 810).

Figure 9A:
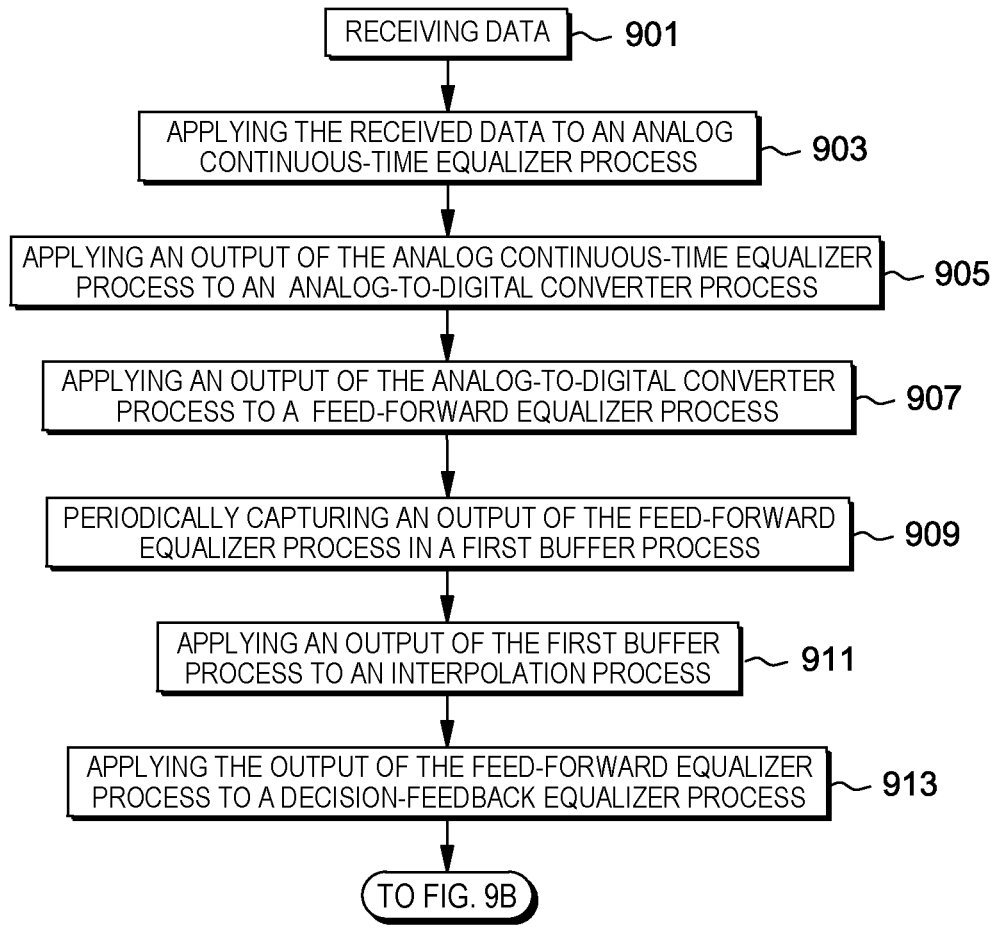
FIGS. 9A and 9B show a block diagram of a method according to an embodiment of the present invention.
Figure 9B:
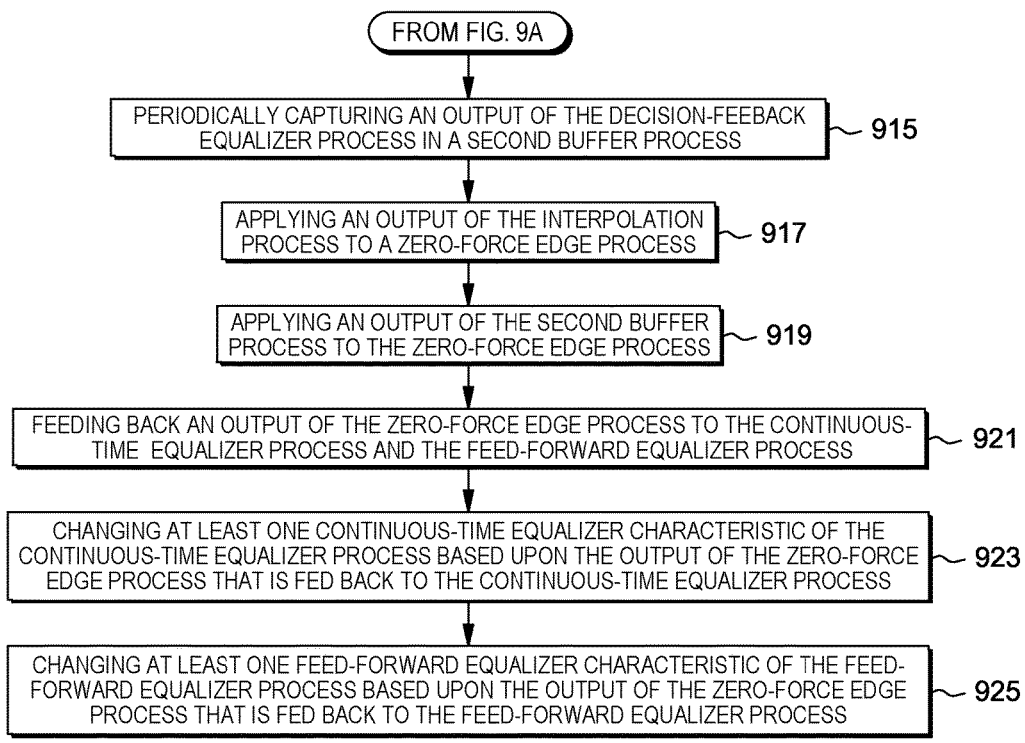

Referring now to FIGS. 9A and 9B, a block diagram of a method according to an embodiment of the present invention is shown. As seen in these FIGS. 9A and 9B, the method comprises: at block 901—receiving data in the form of an analog signal; at block 903—applying the received data to an analog continuous-time equalizer process; at block 905—applying an output of the analog continuous-time equalizer process to an analog-to-digital converter process; at block 907—applying an output of the analog-to-digital converter process to a feed-forward equalizer process; at block 909—periodically capturing an output of the feed-forward equalizer process in a first buffer process; at block 911—applying an output of the first buffer process to an interpolation process; at block 913—applying the output of the feed-forward equalizer process to a decision-feedback equalizer process; at block 915—periodically capturing an output of the decision-feedback equalizer process in a second buffer process; at block 917—applying an output of the interpolation process to a zero-force edge process; at block 919—applying an output of the second buffer process to the zero-force edge process; at block 921—feeding back an output of the zero-force edge process to the continuous-time equalizer process and the feed-forward equalizer process; at block 923—changing at least one continuous-time equalizer characteristic of the continuous-time equalizer process based upon the output of the zero-force edge process that is fed back to the continuous-time equalizer process; and at block 925—changing at least one feed-forward equalizer characteristic of the feed-forward equalizer process based upon the output of the zero-force edge process that is fed back to the feed-forward equalizer process. In one specific example, each of: the first buffer process of block 909 and the interpolation process of block 911 are carried out concurrently with the DFE process of block 913 and the second buffer process of block 915 (wherein the ZFE process of blocks 917 and 919 operates on corresponding edge samples and data samples.

In one specific example, FFE output samples are followed by a DFE of arbitrary length. In another specific example, FFE output samples are followed by a maximum-likelihood sequence estimator ("MLSE"), which may be used to replace a DFE function in some receiver embodiments.

Further, various embodiments of the present invention add a new dimension of flexibility, beyond the conventional ZFE adaptation algorithm (which is typically only capable of finding a peaking setting which decorrelates edge ISI), by varying the interpolator delay offset (thus enabling a user to achieve more or less peaking than the standard ZFE algorithm would provide). The extra flexibility of such embodiments of the present invention may provide enhanced performance under certain channel conditions (e.g., where either more or less peaking than conventional ZFE would normally provide gives better system performance).

As described herein, baud-rate interpolation is shown capable of driving ZFE adaptation to within ~+−1 db of peaking accuracy using 6th order polynomial interpolators, on channels ranging from 10 dB loss to 35 dB loss, over 0 to 0.5 unit interval interpolation delay. In one example, lower loss channels most likely will not occur since the receiver frontend (in this example) will be intentionally bandwidth limited on low loss channels to support baud-rate clock and data recovery ("CDR") operation, which typically requires bandwidth limit in the channel to function correctly.

In another example, the interpolation polynomials could be useable to drive a dynamic-data centering ("DDC") algorithm with an early/late scan-out of approximately +−0.125 unit interval from each sample point. In such an algorithm, a time offset data sample is estimated using the interpolation polynomials instead of an edge sample. A control method can then compare the early/late interpolated data samples with the sampled data to make a determination of proper sample timing and adjust sample timing appropriately earlier or later to achieve a desired centered sample point using conventional methods known in the art.

As described herein, various embodiments may be implemented in software, firmware, hardware or any combination thereof. In one specific example, the firmware may be associated with a hardware device that can be programmed to change the configuration of the device (e.g., an FPGA, or an ASIC).

In another example, the physical implementations and methods described herein may be applied to embedded and/or real-time applications.

As described herein, various embodiments may be used in the context of analog, mixed signal design and communications technologies.

As described herein, various embodiments may utilize at least some level of anti-aliasing filter (lowpass filtering) prior to the ADC. Typically the application channel, receiver electronics, and CTE provide automatically lowpass filtering of sufficient value. In one specific example, an embodiment of the present invention provides a digital receiver that adds a "bandwidth limit" function in the receiver front-end to provide sufficient lowpass filtering so that a baud-rate CDR can work reliably. This "bandwidth limit" function also increases the accuracy of the polynomial interpolation, such that in a practical application of a digital receiver there will always be sufficient anti-aliasing in front of the ADC so the interpolation polynomials can generate sufficiently accurate results to drive the peaking amplifier and FFE adaptation (in one specific example, "infinite bandwidth" data could not be utilized).

As described herein, a method is provided for receiving data in the form of an analog signal; performing an analog continuous-time equalizer process on the received data; performing an analog-to-digital converter process on an output of the analog continuous-time equalizer process; performing a feed-forward equalizer process on an output of the analog-to-digital converter process; periodically capturing, in a first buffer process, an output of the feed-forward equalizer process; performing an interpolation process on an output of the first buffer process; performing a decision-feedback equalizer process on the output of the feed-forward equalizer process; periodically capturing in a second buffer process an output of the decision-feedback equalizer process; performing a zero-force edge process on: (a) an output of the interpolation process and (b) an output of the second buffer process; and feeding back an output of the zero-force edge process to: (a) the analog continuous-time equalizer process and (b) the feed-forward equalizer process.

Various mechanisms may be employed to determine which interpolation delay polynomial to use to compute the interpolated edge. In one example, a conventional technique called an "early/late" phase detector can be used to correlate the interpolated edge with decoded data to find the appropriate interpolation polynomial. Of course, any other appropriate technique may be used to determine which interpolation delay polynomial to use to compute the interpolated edge, such as the open loop estimation method based on a first decision-feedback tap value, etc.

In one embodiment, the FFE is limited to a single postcursor. In another embodiment, a feed-forward equalizer with two or more postcursors ("FFE2+") may be provided where a control method first adapts the peaking amplifier (or CTE), and then adapts the feed-forward equalizer by changing a first tap of the feed-forward equalizer (with the FFE adaptation limited to a single postcursor). This example then shuts off the interpolator-based peaking amplifier/FFE first tap adaptation while the method adaptively equalizes one or more remaining FFE taps (i.e., one or more taps subsequent to the first tap).

In another embodiment, adaptation may be provided to one or more FFE precursor taps (in one specific example, interaction with a common baud-rate clock recovery technique may prohibit adaptation of the first precursor, but a second precursor could be adapted).

In another embodiment a device (e.g., an IC, an FPGA, or an ASIC) may be configured to carry out any process or processes disclosed herein.

In another embodiment, a system is provided, comprising: an analog continuous-time equalizer, the analog continuous-time equalizer being configured to obtain data in the form of an analog signal; an analog-to-digital converter in operative communication with the analog continuous-time equalizer, the analog-to-digital converter being configured to receive an output from the analog continuous-time equalizer; a feed-forward equalizer in operative communication with the analog-to-digital converter, the feed-forward equalizer being configured to receive an output from the analog-to-digital converter; a first buffer in operative communication with the feed-forward equalizer, the first buffer being configured to capture an output of the feed-forward equalizer; an interpolator in operative communication with the first buffer, the interpolator being configured to receive an output from the first buffer; a second buffer, the second buffer being configured to capture one of: (a) the output of the feed-forward equalizer via operative communication with the feed-forward equalizer; and (b) data based upon the output of the feed-forward equalizer; a zero-force edge calculator in operative communication with the interpolator, the second buffer and the analog continuous-time equalizer, the zero-force edge calculator being configured to receive an output from the interpolator and an output from the second buffer, the zero-force edge calculator being further configured to feed back continuous-time equalizer adaptation data to the analog continuous-time equalizer; wherein the continuous-time equalizer adaptation data fed back by the zero-force edge calculator to the analog continuous-time equalizer is based at least in part upon the output from the interpolator and the second buffer.

In one example, the system further comprises a decision-feedback equalizer, the decision-feedback equalizer being in operative communication with the feed-forward equalizer and the second buffer, the decision-feedback equalizer being configured to receive the output of the feed-forward equalizer and provide to the second buffer the data based upon the output of the feed-forward equalizer.

In another example, the system comprises an integrated circuit, and each of the analog continuous-time equalizer, the analog-to-digital converter, the feed-forward equalizer, the first buffer, the interpolator, the decision-feedback equalizer, the second buffer, and the zero-force edge calculator comprises hardware of the integrated circuit.

In another example, the integrated circuit comprises one of an FPGA and an ASIC.

In another example, the system further comprises: a processor comprising hardware; and a memory storing computer-readable instructions that, when executed by the processor, implement each of the analog continuous-time equalizer, the analog-to-digital converter, the feed-forward equalizer, the first buffer, the interpolator, the decision-feedback equalizer, the second buffer, and the zero-force edge calculator comprises hardware of the integrated circuit.

In another example, the system further comprises a receiver component, the receiver component being configured to receive data from outside of the system and to provide the received data to the analog continuous-time equalizer.

In another example, the system comprises an integrated circuit, and the receiver comprises hardware of the integrated circuit.

In another example, the analog continuous-time equalizer is further configured to perform a peaking amplifier process.

In another example, the output of the feed-forward equalizer is data in the form of sequential output samples.

In another example, the interpolator is further configured to use a plurality of optimal fractional delay interpolation polynomials.

In another example, at least one continuous-time equalizer characteristic of the analog continuous-time equalizer is changed based upon the continuous-time equalizer adaptation data that is fed back to the analog continuous-time equalizer.

In another example: the zero-force edge calculator is in operative communication with the feed-forward equalizer and the zero-force edge calculator is further configured to feed back feed-forward equalizer adaptation data to the feed-forward equalizer; the feed-forward equalizer adaptation data fed back by the zero-force edge calculator to the feed-forward equalizer is based at least in part upon the output from the interpolator and the second buffer; and at least one feed-forward equalizer characteristic of the feed-forward equalizer is changed based upon the feed-forward equalizer adaptation data that is fed back to the feed-forward equalizer.

In another embodiment, a method is provided, comprising: receiving data in the form of an analog signal; applying the received data to an analog continuous-time equalizer process; applying an output of the analog continuous-time equalizer process to an analog-to-digital converter process; applying an output of the analog-to-digital converter process to a feed-forward equalizer process; capturing an output of the feed-forward equalizer process in a first buffer process; applying an output of the first buffer process to an interpolation process; capturing in a second buffer process one of: (a) an output of the feed-forward process; and (b) an output of another process based upon the output of the feed-forward process; applying an output of the interpolation process to a zero-force edge process; applying an output of the second buffer process to the zero-force edge process; and feeding back at least part of an output of the zero-force edge process to the analog continuous-time equalizer process.

In one example, the method further comprises a decision-feedback equalizer process, the decision-feedback equalizer process being the other process such that the decision-feedback equalizer process receives the output of the feed-forward equalizer process and provides an output to the second buffer process based upon the output of the feed-forward process.

In another example, the method further comprises: feeding back at least part of the output of the zero-force edge process to the feed-forward equalizer process; changing at least one continuous-time equalizer characteristic of the analog continuous-time equalizer process based upon the output of the zero-force edge process that is fed back to the analog continuous-time equalizer process; and changing at least one feed-forward equalizer characteristic of the feed-forward equalizer process based upon the output of the zero-force edge process that is fed back to the feed-forward equalizer process.

In another example, the method further comprises: feeding back at least part of the output of the zero-force edge process to the feed-forward equalizer process; first changing at least one continuous-time equalizer characteristic of the analog continuous-time equalizer process based upon the output of the zero-force edge process that is fed back to the analog continuous-time equalizer process; then changing a value associated with a first tap of the feed-forward equalizer process; and then changing one or more values associated with one or more respective one or more subsequent taps of the feed-forward equalizer process without further changing the at least one continuous-time equalizer characteristic and without further changing the value associated with the first tap of the feed-forward equalizer process, wherein the changing of the one or more values associated with the one or more respective one or more subsequent taps of the feed-forward equalizer process is not responsive to the output of the zero-force edge process.

In another embodiment, a computer-readable storage device is provided having stored thereon computer-readable instructions that, when executed by a computer, implement: receiving data in the form of an analog signal; applying the received data to an analog continuous-time equalizer process; applying an output of the analog continuous-time equalizer process to an analog-to-digital converter process; applying an output of the analog-to-digital converter process to a feed-forward equalizer process; capturing an output of the feed-forward equalizer process in a first buffer process; applying an output of the first buffer process to an interpolation process; capturing in a second buffer process one of: (a) an output of the feed-forward process; and (b) an output of another process based upon the output of the feed-forward process; applying an output of the interpolation process to a zero-force edge process; applying an output of the second buffer process to the zero-force edge process; and feeding back at least part of an output of the zero-force edge process to the analog continuous-time equalizer process.

In one example, the computer-readable instructions, when executed by the computer, further implement a decision-feedback equalizer process, the decision-feedback equalizer process being the other process such that the decision-feedback equalizer process receives the output of the feed-forward equalizer process and provides an output to the second buffer process based upon the output of the feed-forward process.

In another example, the computer-readable instructions, when executed by the computer, further implement: feeding back at least part of the output of the zero-force edge process to the feed-forward equalizer process; changing at least one continuous-time equalizer characteristic of the analog continuous-time equalizer process based upon the output of the zero-force edge process that is fed back to the analog continuous-time equalizer process; and changing at least one feed-forward equalizer characteristic of the feed-forward equalizer process based upon the output of the zero-force edge process that is fed back to the feed-forward equalizer process.

In another example, the computer-readable instructions, when executed by the computer, further implement: feeding back at least part of the output of the zero-force edge process to the feed-forward equalizer process; first changing at least one continuous-time equalizer characteristic of the analog continuous-time equalizer process based upon the output of the zero-force edge process that is fed back to the analog continuous-time equalizer process; then changing a value associated with a first tap of the feed-forward equalizer process; and then changing one or more values associated with one or more respective one or more subsequent taps of the feed-forward equalizer process without further changing the at least one continuous-time equalizer characteristic and without further changing the value associated with the first tap of the feed-forward equalizer process, wherein the changing of the one or more values associated with the one or more respective one or more subsequent taps of the feed-forward equalizer process is not responsive to the output of the zero-force edge process.

In another example, any steps described herein may be carried out in any desired appropriate order.

While the present invention has been shown and described with respect to various embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims. In addition, all of the examples disclosed herein are intended to be illustrative, and not restrictive.

What is claimed is:

1. A system, comprising:
    an analog continuous-time equalizer, the analog continuous-time equalizer being configured to obtain data in the form of an analog signal;
    an analog-to-digital converter in operative communication with the analog continuous-time equalizer, the analog-to-digital converter being configured to receive an output from the analog continuous-time equalizer;
    a feed-forward equalizer in operative communication with the analog-to-digital converter, the feed-forward equalizer being configured to receive an output from the analog-to-digital converter;
    a first buffer in operative communication with the feed-forward equalizer, the first buffer being configured to capture an output of the feed-forward equalizer;
    an interpolator in operative communication with the first buffer, the interpolator being configured to receive an output from the first buffer;
    a second buffer, the second buffer being configured to capture one of: (a) the output of the feed-forward equalizer via operative communication with the feed-forward equalizer; and (b) data based upon the output of the feed-forward equalizer;
    a zero-force edge calculator in operative communication with the interpolator, the second buffer and the analog continuous-time equalizer, the zero-force edge calculator being configured to receive an output from the interpolator and an output from the second buffer, the zero-force edge calculator being further configured to feed back continuous-time equalizer adaptation data to the analog continuous-time equalizer;
    wherein the continuous-time equalizer adaptation data fed back by the zero-force edge calculator to the analog continuous-time equalizer is based at least in part upon the output from the interpolator and the second buffer.

2. The system of claim 1, further comprising a decision-feedback equalizer, the decision-feedback equalizer being in operative communication with the feed-forward equalizer and the second buffer, the decision-feedback equalizer being configured to receive the output of the feed-forward equalizer and provide to the second buffer the data based upon the output of the feed-forward equalizer.

3. The system of claim 2, wherein the system comprises an integrated circuit, and each of the analog continuous-time equalizer, the analog-to-digital converter, the feed-forward equalizer, the first buffer, the interpolator, the decision-feedback equalizer, the second buffer, and the zero-force edge calculator comprises hardware of the integrated circuit.

4. The system of claim 3, wherein the integrated circuit comprises one of an FPGA and an ASIC.

5. The system of claim 2, wherein the system further comprises:
    a processor comprising hardware; and
    a memory storing computer-readable instructions that, when executed by the processor, implement each of the analog continuous-time equalizer, the analog-to-digital converter, the feed-forward equalizer, the first buffer, the interpolator, the decision-feedback equalizer, the second buffer, and the zero-force edge calculator comprises hardware of the integrated circuit.

6. The system of claim 1, wherein the system further comprises a receiver component, the receiver component being configured to receive data from outside of the system and to provide the received data to the analog continuous-time equalizer.

7. The system of claim 6, wherein the system comprises an integrated circuit, and the receiver comprises hardware of the integrated circuit.

8. The system of claim 1, wherein the analog continuous-time equalizer is further configured to perform a peaking amplifier process.

9. The system of claim 1, wherein the output of the feed-forward equalizer is data in the form of sequential output samples.

10. The system of claim 1, wherein the interpolator is further configured to use a plurality of optimal fractional delay interpolation polynomials.

11. The system of claim 1, wherein at least one continuous-time equalizer characteristic of the analog continuous-time equalizer is changed based upon the continuous-time equalizer adaptation data that is fed back to the analog continuous-time equalizer.

12. The system of claim 1, wherein:
    the zero-force edge calculator is in operative communication with the feed-forward equalizer and the zero-force edge calculator is further configured to feed back feed-forward equalizer adaptation data to the feed-forward equalizer;
    wherein the feed-forward equalizer adaptation data fed back by the zero-force edge calculator to the feed-forward equalizer is based at least in part upon the output from the interpolator and the second buffer; and
    at least one feed-forward equalizer characteristic of the feed-forward equalizer is changed based upon the feed-forward equalizer adaptation data that is fed back to the feed-forward equalizer.

13. A method, comprising:
    receiving data in the form of an analog signal;
    applying the received data to an analog continuous-time equalizer process;
    applying an output of the analog continuous-time equalizer process to an analog-to-digital converter process;
    applying an output of the analog-to-digital converter process to a feed-forward equalizer process;
    capturing an output of the feed-forward equalizer process in a first buffer process;
    applying an output of the first buffer process to an interpolation process;
    capturing in a second buffer process one of: (a) an output of the feed-forward process; and (b) an output of another process based upon the output of the feed-forward process;
    applying an output of the interpolation process to a zero-force edge process;
    applying an output of the second buffer process to the zero-force edge process; and
    feeding back at least part of an output of the zero-force edge process to the analog continuous-time equalizer process.

14. The method of claim 13, further comprising a decision-feedback equalizer process, the decision-feedback equalizer process being the other process such that the decision-feedback equalizer process receives the output of the feed-forward equalizer process and provides an output to the second buffer process based upon the output of the feed-forward process.

15. The method of claim 13, further comprising:
feeding back at least part of the output of the zero-force edge process to the feed-forward equalizer process;
changing at least one continuous-time equalizer characteristic of the analog continuous-time equalizer process based upon the output of the zero-force edge process that is fed back to the analog continuous-time equalizer process; and
changing at least one feed-forward equalizer characteristic of the feed-forward equalizer process based upon the output of the zero-force edge process that is fed back to the feed-forward equalizer process.

16. The method of claim 13, further comprising:
feeding back at least part of the output of the zero-force edge process to the feed-forward equalizer process;
first changing at least one continuous-time equalizer characteristic of the analog continuous-time equalizer process based upon the output of the zero-force edge process that is fed back to the analog continuous-time equalizer process;
then changing a value associated with a first tap of the feed-forward equalizer process; and
then changing one or more values associated with one or more respective one or more subsequent taps of the feed-forward equalizer process without further changing the at least one continuous-time equalizer characteristic and without further changing the value associated with the first tap of the feed-forward equalizer process, wherein the changing of the one or more values associated with the one or more respective one or more subsequent taps of the feed-forward equalizer process is not responsive to the output of the zero-force edge process.

17. A non-transitory computer-readable storage device having stored thereon computer-readable instructions that, when executed by a computer, implement:
receiving data in the form of an analog signal;
applying the received data to an analog continuous-time equalizer process;
applying an output of the analog continuous-time equalizer process to an analog-to-digital converter process;
applying an output of the analog-to-digital converter process to a feed-forward equalizer process;
capturing an output of the feed-forward equalizer process in a first buffer process;
applying an output of the first buffer process to an interpolation process;
capturing in a second buffer process one of: (a) an output of the feed-forward process; and (b) an output of another process based upon the output of the feed-forward process;
applying an output of the interpolation process to a zero-force edge process;
applying an output of the second buffer process to the zero-force edge process; and
feeding back at least part of an output of the zero-force edge process to the analog continuous-time equalizer process.

18. The non-transitory computer-readable storage device of claim 17, wherein the computer-readable instructions, when executed by the computer, further implement a decision-feedback equalizer process, the decision-feedback equalizer process being the other process such that the decision-feedback equalizer process receives the output of the feed-forward equalizer process and provides an output to the second buffer process based upon the output of the feed-forward process.

19. The non-transitory computer-readable storage device of claim 17, wherein the computer-readable instructions, when executed by the computer, further implement:
feeding back at least part of the output of the zero-force edge process to the feed-forward equalizer process;
changing at least one continuous-time equalizer characteristic of the analog continuous-time equalizer process based upon the output of the zero-force edge process that is fed back to the analog continuous-time equalizer process; and
changing at least one feed-forward equalizer characteristic of the feed-forward equalizer process based upon the output of the zero-force edge process that is fed back to the feed-forward equalizer process.

20. The non-transitory computer-readable storage device of claim 17, wherein the computer-readable instructions, when executed by the computer, further implement:
feeding back at least part of the output of the zero-force edge process to the feed-forward equalizer process;
first changing at least one continuous-time equalizer characteristic of the analog continuous-time equalizer process based upon the output of the zero-force edge process that is fed back to the analog continuous-time equalizer process;
then changing a value associated with a first tap of the feed-forward equalizer process; and
then changing one or more values associated with one or more respective one or more subsequent taps of the feed-forward equalizer process without further changing the at least one continuous-time equalizer characteristic and without further changing the value associated with the first tap of the feed-forward equalizer process, wherein the changing of the one or more values associated with the one or more respective one or more subsequent taps of the feed-forward equalizer process is not responsive to the output of the zero-force edge process.

* * * * *